United States Patent [19]

Sandvos et al.

[11] Patent Number: 5,553,019
[45] Date of Patent: Sep. 3, 1996

[54] WRITE-ONCE READ-MANY MEMORY USING EEPROM CELLS

[75] Inventors: Jerry L. Sandvos, Davie; Kenneth D. Alton, Coral Springs, both of Fla.

[73] Assignee: Motorola, Inc., Schaumburg, Ill.

[21] Appl. No.: 376,518

[22] Filed: Jan. 23, 1995

[51] Int. Cl.⁶ .................................................. G11C 11/34
[52] U.S. Cl. ........................... 365/185.04; 365/185.29; 365/104; 365/201
[58] Field of Search ................................ 365/104, 900, 365/185, 195, 201, 185.04, 185.29

[56] References Cited

U.S. PATENT DOCUMENTS

| | | | |
|---|---|---|---|
| 4,130,889 | 12/1978 | Chua | 365/96 |
| 4,152,627 | 5/1979 | Priel et al. | 365/227 |
| 4,733,386 | 3/1988 | Shimoi | 369/59 |
| 5,175,840 | 12/1992 | Sawase et al. | 365/195 X |
| 5,226,006 | 7/1993 | Wang et al. | 365/195 X |
| 5,229,972 | 7/1993 | Kondo et al. | 365/230.03 |
| 5,293,610 | 3/1994 | Schwarz | 365/195 X |
| 5,381,369 | 1/1995 | Kikuchi et al. | 365/195 X |

*Primary Examiner*—David C. Nelms
*Assistant Examiner*—Huan Hoang
*Attorney, Agent, or Firm*—Frank M. Scutch, III

[57] ABSTRACT

A write-once read-many memory system (10) for electronically securing a select portion of memory from being overwritten or erased. Memory system (10) includes one or more storage cells (25) for providing electronic storage of information. A control cell (13) is used for controlling writing and/or erasing access to the storage cells (25). Control logic (11) is provided to control access to the control cell (13). Control cell (13) and control logic (11) are used as a gate to provide selective access to storage cells (25) through write control line (19) and erase control line (21). Storage cells (25) can only be accessed when the control cell (13) in an appropriate logic state.

9 Claims, 1 Drawing Sheet

WRITE-ONCE READ-MANY MEMORY USING EEPROM CELLS

TECHNICAL FIELD

This invention relates in general to solid state memory and more particularly to memory security.

BACKGROUND

Microcomputers which are typically used today integrate read only memory (ROM) and electronic erasable programmable read only memory (EEPROM) onto an integrated circuit or chip to provide both program space and user configurable non-volatile storage area. Current portable electronic devices such as cellular telephones or radios require permanent write once, read many storage areas for serial numbers, and subscriber billing information. These numbers must remain secure to prevent persons from accidentally or maliciously making changes to defeat billing mechanisms.

A variety of systems have been used in the prior art to allow a memory cell to be written to only once while reading from the cell any number of times. One technique designated one-time programmable (OTP) ROM uses an ultra-violet EEPROM. This involves using ultraviolet light to program and/or erase data in a memory device. When an opaque molding is used with the die holding the memory device, ultraviolet light is prevented from contacting the memory cells effectively shielding the cells and preventing them from being programmed or erased. Although this technique offers advantages in providing a adequate level of security, it involves many extras processing steps when manufacturing the memory as well has a high part cost in view of the opaque molding which must be used.

Thus, the need exists to provide a memory device which provides a high level of security without the burden of extra processing steps to implement and/or utilize ultra-violet EEPROM.

DETAILED DESCRIPTION OF THE PREFERRED EMBODIMENT

Figure 1:
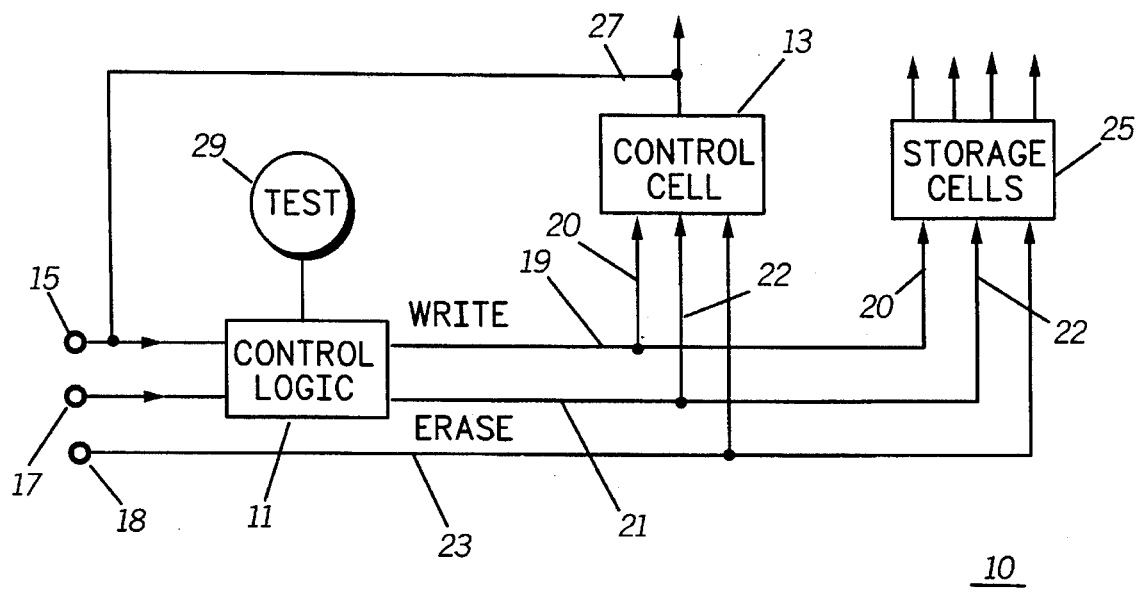
FIG. 1 is a block diagram showing operation of a write-once read-many memory system in accordance with the present invention.

Referring now to FIG. 1, a write-once read-many memory system 10 includes control logic 11 which is attached to a control cell 13. Control logic 11 is used to control access of write input 15 and erase input 17 to write control line 19 and erase control line 21 respectively. Read input 18 and read control line 23 is unaffected by control logic 11 and data may be read from storage cells 25 at any time. Storage cells 25 are used to electronically store data information and may be EEPROM or the like. Control cell 13 acts as a gate to control write control line 19 and erase control line 21 to a one or more storage cells 25. Any data information stored in either control cell 13 or storage cells 25 enters in a appropriate write port 20 or erase port 22. Thus, the logic state of control cell 13 is represented at output 27 which is used to disable control logic 11. Once control logic 11 is enabled, further access to storage cells 25 using write control line 19 and erase control line 21 is prohibited. Selective access is only possible when control cell 13 provides the correct logic state to control line 23. Finally, a test node 29 is connected to control logic 11 and acts to provide a means by which writing and erasing of storage cells 25 can be tested overriding control logic 11.

Figure 2:
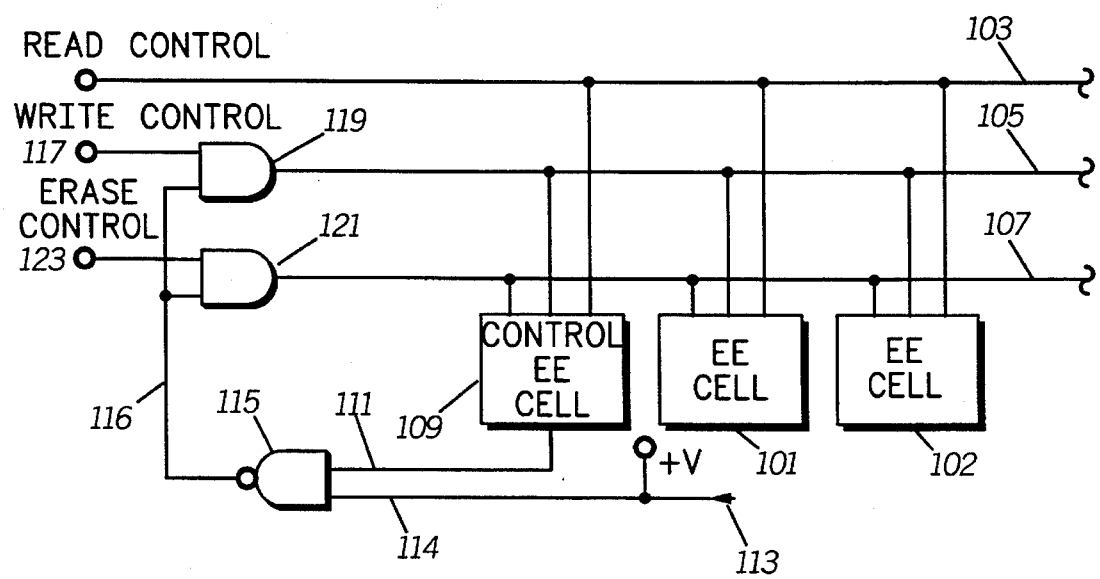
FIG. 2 is a block diagram showing operation of a write-once read-many EEPROM system in accordance with a preferred embodiment of the invention.

FIG. 2 illustrates a preferred embodiment of memory system 100 utilizing EEPROM's that includes a device which allows the memory to be written to only one time while reading from the memory any number of times. Memory which is written to once and read many times is referred to as write-once, read-many (WORM) area. Although EEPROM is depicted here, it will be evident to those skilled in the art that any type of electronically erasable type memory can be used.

Memory system 100 includes one or more electronically erasable (EE) storage cells 101. EE storage cells 101 are each attached to a read bus line 103, write bus line 105 and erase bus line 107. Read bus line 103 provides logic information, which is stored in an appropriate EE storage cell 101 and moved to a controlling microprocessor (not shown), other EE storage cells 101 or peripherals (not shown) which may be located on read bus line 103. Write bus line 105 is used to write or overwrite information to a EE storage cell 101 while erase bus line 107 is used to send erasing control information to a EE storage cell 101. Write bus line 105 may be used to write or overwrite logic information over existing logic stored in EE storage cell 101 while erase bus line 107 is used to delete or erase logic information stored within a EE storage cell 101.

In order to control logic information which can be written or erased from a EE storage cell 101, an individual EE storage cell is used as a gate or lock circuit to control and/or prevent logic information which may be placed on write bus line 105 and erase bus line 107 from reaching any of EE storage cells 101 designated as WORM. The lock circuit includes a EE control cell 109 which is connected to read bus line 103, write bus line 105 and erase bus line 107. EE control cell 109 provides a control output 111 which is used along with test node 113 and voltage input 114 as an input to NAND gate 115. The output of NAND gate 115 provides a control input 116 along with write input to AND gate 119. Thus, when both control input 116 and write input 117 are enabled i.e. at a logic 1 state, access to write bus line 105 will be granted and logic information may be written onto the bus and to any one of EE storage cells 101 with an appropriate address. Similarly, control input 116 and erase input 123 provide an input to AND gate 121. When both control input 116 and erase input 123 are enabled, AND gate 121 grants or allows access to erase bus line 107. Erase data can then be send to any of EE cells 101 connected to erase bus line 107 with an appropriate address. It should also be evident to those skilled in the art that NAND gate 115, AND gate 119 and AND gate 121 are standard logic gates. A test node 113 is also included with the chip carrier (not shown) which houses EE control cell 109 and EE memory cells 101 to allow limited access for testing before the chip carrier is permanently sealed. No external connections are provided to test node 113 as this would defeat the security features of the lock circuit.

The preferred method of using memory system 100 includes of electronically securing at least one memory cell in a plurality of memory cells. The at least one memory cell includes a write port and erase port. An electronic gate is positioned serially with the at least one memory cell and the gate is controlled to allow the write port and erase port to be accessed only upon applying an appropriate logic state to the electronic gate. More specifically the positioning step involves designating a control cell from one of the plurality of memory cells. At least one logic gate is attached to the control cell and an output of the control cell is connect to the logic gate to create the electronic gate for preventing access to the remaining memory cells.

In operation, AND gate 119, AND gate 121 and NAND gate 115 determine the logic state of EE control cell 109. If EE control cell 109 is at a logic 0 state, all EE storage cells 101 can be read from, written to or erased using either read bus line 103, write bus line 105 or erase bus line 107 respectively. If EE control cell 109 is in a logic 1 state both write bus line 105 and erase bus line 107 are held inactive no logic information may be direct to any of EE storage cells 101. If test node 113 is held at a logic 0 state using a test probe, both EE storage cells 10 1 and EE control cell 109 can be read from, written to or erased regardless of sate of EE control cell 109.

Hence, once memory system 100 is packaged, EE storage cells 101 may be either written or erased until EE control cell 109 is programmed to a logic 1 state. This allows a logic structure to be created which writes once to EE storage cell 101 and can be read, any number of times. Also, EE storage cell 101 may be write tested at the die level using test node 113. Test node 113 is packaged within a chip carrier with EE storage cell 101 and EE control cell 109 to prevent unauthorized access to test node 113. In general, test node 113 is used before the chip carrier is sealed to ensure memory system 100 is operating correctly.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A write-once read-many memory system comprising:
   a first memory cell for providing electronic storage of information;
   a second memory cell for controlling writing access to said first memory cell;
   access means for providing access to said second memory cell;
   a first bus connected to said first memory cell and said second memory cell for proving read logic information;
   a second bus connected to said first memory cell and said second memory cell for providing write logic information;
   a third bus connected to said first memory cell and said second memory cell for providing erase information;
   wherein said access means comprises:
   a first logic gate for controlling access to said second bus;
   a second logic gate for controlling access to said third bus; and
   a third logic gate for controlling access to said first logic gate and said second logic gate; and
   wherein said second memory cell provides selective access to said first memory cell to allow said first memory cell to write or erase said information when said second memory cell is in an appropriate logic state and further wherein said third logic gate includes an input for receiving logic information from said second memory cell and a test node.

2. A write-once read-many memory system as in claim 1 wherein said test node is positioned within a chip carrier with said first memory cell and said second memory cell for providing limited access to said test node.

3. A write-once read-many memory system as in claim 1 wherein said first memory cell is an electrically erasable programmable read only memory.

4. A write-once read-many memory system as in claim 1 wherein said second memory cell is an electronically erasable programmable read only memory.

5. A write-once read-many memory system as in claim 1 wherein said access means includes at least one logic gate.

6. A write-once read-many memory system as in claim 1 wherein said first logic gate and said second logic gate are AND gates.

7. A write-once read-many memory system as in claim 6 wherein said third logic gate is a NAND gate.

8. A memory network which includes a device which enables information to be written into a memory cell one time and read from said memory cell any number of times, said memory network comprising:
   at least one electronically erasable memory storage cell for storing logic information;
   an electronically erasable memory control cell for controlling access to said at least one electronically erasable memory storage cell;
   a read control bus for providing read data from said at least one electronically erasable storage cell and said electronically erasable memory control cell;
   a write control bus for providing write data to said at least one electronically erasable memory storage cell and said electronically erasable memory control cell;
   an erase control bus for providing erasing data to said at least one electronically erasable memory storage cell and said electronically erasable memory control cell;
   a first gate for controlling operation of said write control bus;
   a second gate for controlling operation of said erase control bus;
   a third gate for controlling access to said electronically erasable memory storage cell and said electronically erasable memory control cell;
   a control node connected to said third gate for providing logic information to access said third gate; and
   wherein said at least one electronically erasable memory storage cell and said electronically erasable memory control cell are EEPROM and further wherein said first gate and said second gate are AND gates and said third gate is a NAND gate.

9. A memory network as in claim 8 wherein said control node is provided with said at least one electronically erasable memory storage cell and said electronically erasable memory control cell on an integrated circuit and said control node is inaccessible outside said integrated circuit for preventing unauthorized access to said at least one electronically erasable memory storage cell.

* * * * *